United States Patent
Andrews et al.

(10) Patent No.: US 7,605,609 B1
(45) Date of Patent: Oct. 20, 2009

(54) PROGRAMMABLE LEVEL SHIFTER

(75) Inventors: William B. Andrews, Macungie, PA (US); Mou C. Lin, High Bridge, NJ (US); John Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/957,598

(22) Filed: Dec. 17, 2007

(51) Int. Cl.
*H03K 19/0175* (2006.01)
(52) U.S. Cl. ............................. 326/68; 326/63; 326/81; 326/83
(58) Field of Classification Search ............. 326/62–63, 326/68, 80–83, 86–87; 327/333
See application file for complete search history.

(56) References Cited

U.S. PATENT DOCUMENTS

| | | | |
|---|---|---|---|
| 5,528,172 A | 6/1996 | Sundstrom | 326/80 |
| 6,025,737 A * | 2/2000 | Patel et al. | 326/80 |
| 6,066,977 A | 5/2000 | Felton et al. | 327/390 |
| 6,249,145 B1 * | 6/2001 | Tanaka et al. | 326/68 |
| 6,462,602 B1 | 10/2002 | Potter | 327/333 |
| 6,717,451 B1 | 4/2004 | Klein et al. | 327/333 |
| 7,019,559 B2 * | 3/2006 | Kouzuma | 326/87 |
| 7,400,168 B2 * | 7/2008 | Katou | 326/68 |
| 7,432,740 B2 * | 10/2008 | Kanzaki | 326/68 |

* cited by examiner

*Primary Examiner*—Vibol Tan
*Assistant Examiner*—Christopher Lo
(74) *Attorney, Agent, or Firm*—Mendelsohn, Drucker & Associates, P.C.

(57) ABSTRACT

In one embodiment of the invention, a programmable level shifter can be selectively configured to operate in either a high-speed mode or a low-power mode. In both modes, the level shifter converts an input signal in one power supply domain into an output signal in another power supply domain. In the high-speed mode, p-type devices are configured as a current-mirror amplifier that provides the level shifter with relatively fast switching speed. In the low-power mode, the same p-type devices are configured as a cross-coupled latch that provides the level shifter with relatively low power consumption. Selectively enabled n-type devices provide the low-power mode with larger effective n-type devices to flip the cross-coupled latch formed by the p-type devices in the low-power mode.

16 Claims, 2 Drawing Sheets

100

200

300

300

PROGRAMMABLE LEVEL SHIFTER

TECHNICAL FIELD

The present invention relates to electronics, and, in particular, to level shifters for programmable logic devices, such as field-programmable gate arrays (FPGAs), and other integrated circuits that use multiple power supplies.

BACKGROUND

In integrated circuits having multiple power supplies, as signals cross from one power-supply domain to another, the signals need to be level-shifted. Level shifters can be categorized into two types: high-speed and low-power. Depending on the application of the signal being level-shifted, the application may need a fast data path signal or a slower control signal with lower performance requirements. High-speed level shifters typically require more power and/or greater area than low-power level shifters. Some conventional high-speed level shifters consume both static DC power and transient power associated with switching, while low-power level shifters do not consume static DC power. The transient switching power of both level-shifter types is associated with charging and discharging, as signal potentials change from high to low or low to high.

A low-power level shifter transiently flows current while turning some devices on and other devices off. The transient current is used for the charging and discharging of signal potentials from one rail to another. Low-power level shifter nodes fully swing. The advantage of low-power level shifters is the absence of a static power component; the disadvantage is the relatively low speed. The NFETs of a low-power level shifter are used to over drive the current state of the latch. The larger the NFETs, the faster the transition and the faster the level shifter.

A high-speed level shifter may have nodes that do not swing from rail to rail. In this case, there is DC power for as long as one or more signals are not at a rail voltage. This power is due to a static current passing through an impedance. When current flows, the device is on. As long as current stays flowing, the device stays on. Therefore, the high-speed level shifter has states where some devices flow static current. The advantage is relatively high speed; the disadvantage is relatively high power (both static and transient power components). A high-speed level shifter can be thought of as a current source with an enable/disable.

FIG. 1 shows a schematic diagram of a conventional high-speed level shifter 100 of the prior art. High-speed level shifter 100 converts input signal 102 in the domain of power supply Pwr1 into output signal 104 in the domain of power supply Pwr2. As shown in FIG. 1, p-type field effect transistor (PFET) HP1 is diode-connected, and PFETs HP1 and HP2 are configured to provide a current-mirror scheme. Turning on n-type FET (NFET) HN1 creates a current source between Pwr2 and ground, through HP1 and HN1. This current is mirrored to device HP2.

If input signal 102 is driven towards ground (i.e., low), then inverter 106 drives inverted input signal 108 towards power supply Pwr1. These two signals turn NFET HN1 off and NFET HN2 on, respectively. Turning off HN1 disables the current source, and turning on HN2 drives output signal 104 towards ground. With HN1 off, node 110 will be driven high through the PFET HP1 diode. The HP1 diode will pull node 110 all the way to Pwr2.

If input signal 102 is driven towards power supply Pwr1 (i.e., high in the Pwr1 domain), then HN1 turns on and HN2 turns off, due to inverter 106. Turning on HN1 turns on the current source through HP1/HN1 and drives node 110 low. But node 110 does not go all the way to ground, because of the IR drop across HN1. HN1 has an intrinsic impedance. As the current flows through HN1/HN2, there is a voltage potential created across HN1. This potential is a function of ohms law (V=IR). The current through the HP1 and HN1 devices is mirrored to HP2. With the gate-source voltage being the same across both HP1 and HP2, HP2 turns on. Turning on HP2 drives output signal 104 towards power supply Pwr2 (i.e., high in the Pwr2 domain), thereby converting input signal 102 at Pwr1 into output signal 104 at Pwr2.

Since, as described above, diode-connected HP1 prevents node 110 from swinging from rail to rail (i.e., from ground to Pwr2, and vice versa), level shifter 100 can react quicker to changes in input signal 102 than if node 110 did swing rail to rail.

As described, if input signal 102 is low, then HN1 is off, HN2 is on, and HP1 and HP2 are off. As such, with input signal 102 low, there are no DC paths from power supply Pwr2 to ground. However, if input signal 102 is high, then both HN1 and HP1 are on, and DC current flows through those two transistors from power supply Pwr2 to ground, as represented in FIG. 1. As a result, there is a DC current flowing through high-speed level shifter 100 if input signal 102 is high.

FIG. 2 shows a schematic diagram of a conventional low-power level shifter 200 of the prior art. Like high-speed level shifter 100 of FIG. 1, low-power level shifter 200 converts input signal 202 in the domain of power supply Pwr1 into output signal 204 in the domain of power supply Pwr2. Unlike high-speed level shifter 100 of FIG. 1, which has diode-connected HP1, low-power level shifter 200 has PFETs LP1 and LP2 cross-coupled to provide a latching scheme.

If input signal 202 is driven towards ground (i.e., low), then inverter 206 drives inverted input signal 208 towards power supply Pwr1. These two signals turn NFET LN1 off and NFET LN2 on, respectively. Turning on LN2 drives output signal 204 towards ground, which, in turn, turns on PFET LP1. With LN1 off and LP1 on, LP1 will drive node 210 high, thereby turning off PFET LP2.

If input signal 202 is driven towards power supply Pwr1 (i.e., high in the Pwr1 domain), then LN1 turns on and LN2 turns off, due to inverter 206. Turning on LN1 drives node 210 low, which turns on LP2. Turning on LP2 drives output signal 204 towards power supply Pwr2 (i.e., high in the Pwr2 domain), thereby converting input signal 202 at Pwr1 into output signal 204 at Pwr2. Driving output signal 204 high also turns PFET LP1 off.

As described, if input signal 202 is low, then LN1 is off, LN2 is on, LP1 is on, and LP2 is off. As such, with input signal 202 low, there are no DC paths from power supply Pwr2 to ground. Similarly, if input signal 202 is high, then LN1 is on, LN2 is off, LP1 is off, and LP2 is on. As such, with input signal 202 low, there are also no DC paths from power supply Pwr2 to ground. As a result, there is never a DC current flowing through low-power level shifter 200. On the other hand, low-power level shifter 200 is slower than a comparable implementation of high-speed level shifter 100 due to the time required to flip the latch formed by the cross-coupled PFETs. Typical implementations of low-power level shifter 200 use relatively large NFETs to over-drive the cross-coupled PFETs.

SUMMARY

In one embodiment, the present invention is an integrated circuit having a programmable level shifter adapted to selectively operate in either a high-speed mode or a low-power mode to convert an input signal in a first power supply domain into an output signal in a second power supply domain different from the first power supply domain. Switching speed of the level shifter is higher in the high-speed mode than in the low-power mode, while power consumption of the level shifter is lower in the low-power mode than in the high-speed mode.

In another embodiment, the present invention is an integrated circuit comprising first means for converting, in a high-speed mode, an input signal in a first power supply domain into an output signal in a second power supply domain different from the first power supply domain. The integrated circuit further comprises second means for converting, in a low-power mode, the input signal in the first power supply domain into the output signal in the second power supply domain. The switching speed of the first means is higher than the switching speed of the second means, and the power consumption of the first means is lower than the power consumption of the second means. The first and second means share at least one circuit element.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 3:
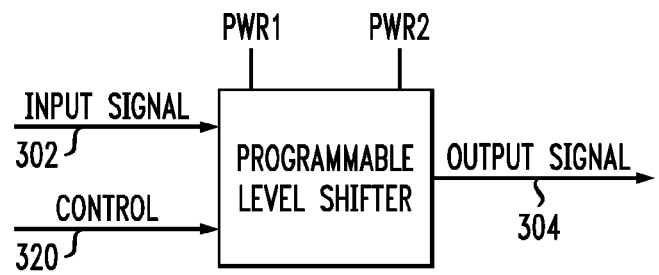
FIG. 3 shows a high-level block diagram of a programmable level shifter according to one embodiment of the present invention.

FIG. 3 shows a high-level block diagram of a programmable level shifter 300, according to one embodiment of the present invention. In general, level shifter 300 converts input signal 302 in the domain of power supply Pwr1 into output signal 304 in the domain of power supply Pwr2. Level shifter 300 supports two different modes of operation: high-speed and low-power, as determined by mode-control signal 320. For example, if mode-control signal 320 is high (e.g., logic one), then level shifter 300 operates in high-speed mode, and if mode-control signal 320 is low (e.g., logic zero), then level shifter 300 operates in low-power mode. As their names suggest, if operated in high-speed mode, the switching speed and power consumption of level shifter 300 are both greater than if operated in low-power mode. Depending on the particular implementation, mode-control signal 320 can be bit-programmable, user-controlled, metal-programmable, and/or fuse-programmable.

Figure 1:
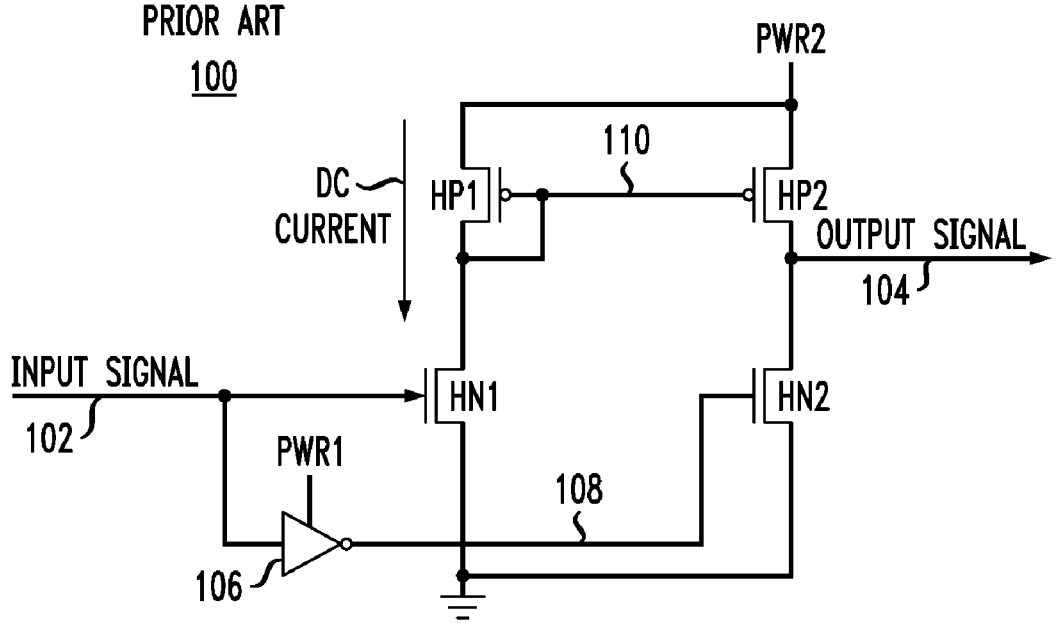
FIG. 1 shows a schematic diagram of a conventional high-speed level shifter of the prior art.
Figure 4:
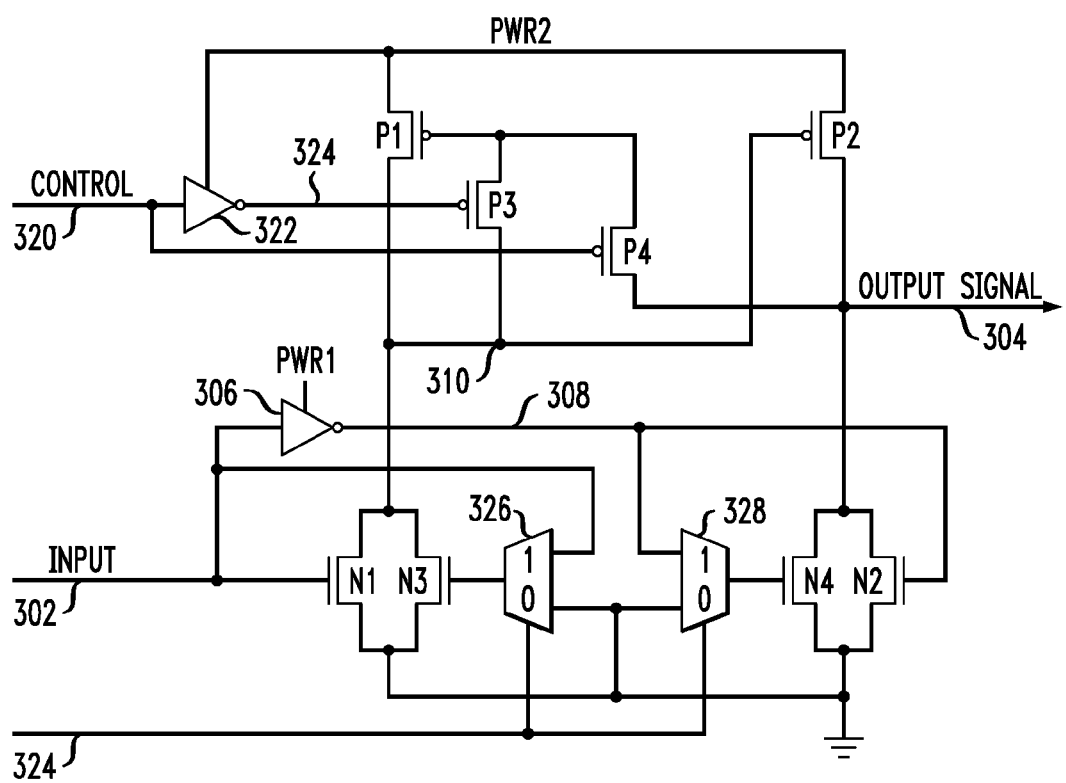
FIG. 4 shows a schematic diagram of one possible implementation of the programmable level shifter of FIG. 3.

FIG. 4 shows a schematic diagram of one possible implementation of programmable level shifter 300 of FIG. 3. If mode-control signal 320 is high (i.e., high-speed mode), then inverter 322 drives inverted mode-control signal 324 low. These two signals turn PFET P3 on and PFET P4 off. With P3 on and P4 off, PFET P1 is diode-connected and the gates of both PFETs P1 and P2 are connected to node 310. As such, in high-speed mode, P1 and P2 have the same configuration as HP1 and HP2 of high-speed level shifter 100 of FIG. 1.

Figure 2:
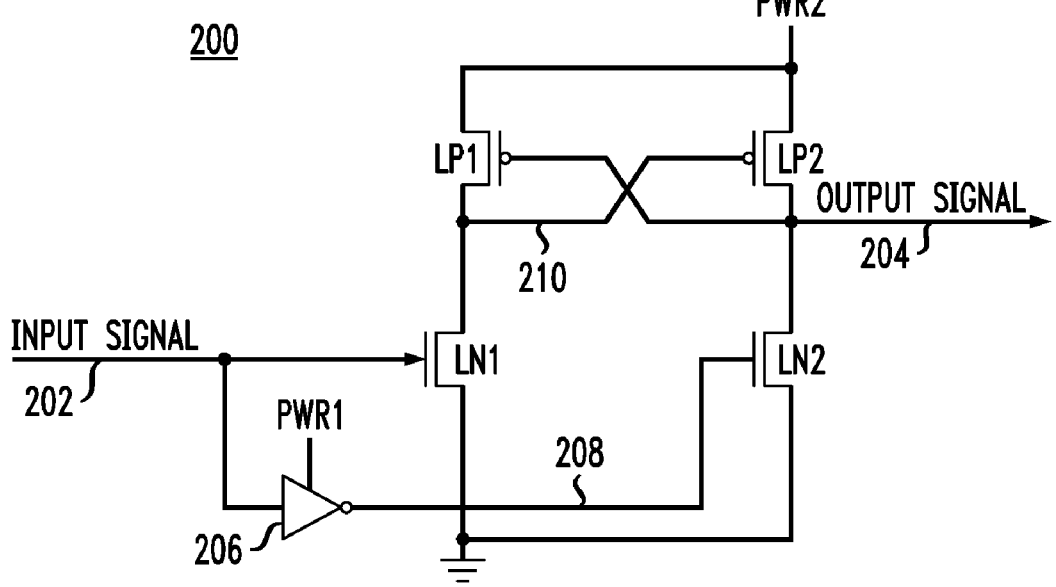
FIG. 2 shows a schematic diagram of a conventional low-power level shifter of the prior art.

If mode-control signal 320 is low (i.e., low-power mode), then inverter 322 drives inverted mode-control signal 324 high. These two signals turn PFET P3 off and PFET P4 on. With P3 off and P4 on, P1 and P2 are cross-coupled to output node 304 and node 310, respectively. As such, in low-power mode, P1 and P2 have the same configuration as LP1 and LP2 of low-power level shifter 200 of FIG. 2.

In addition, inverted mode-control signal 324 controls muxes 326 and 328. In particular, in high-speed mode, inverted mode-control signal 324 is low, which ties the gates of NFETs N3 and N4 to ground, thereby disabling N3 and N4 for the high-speed mode. As such, in high-speed mode, programmable level shifter 300 operates in a manner analogous to that of high-speed level shifter 100 of FIG. 1, with transistors P1, P2, N1, and N2 of level shifter 300 analogous to transistors HP1, HP2, HN1, and HN2, respectively, of level shifter 100.

In low-power mode, inverted mode-control signal 324 is high, which causes input signal 302 to be applied to the gate of N3 and inverted input signal 308 to be applied to the gate of N4. Thus, if input signal 302 is high and inverted input signal 308 from inverter 306 is low, then both NFETs N1 and N3 are on, and both NFETs N2 and N4 are off. Similarly, if input signal 302 is low and inverted input signal 308 is high, then N1 and N3 are both off, and N2 and N4 are both on. As such, in low-power mode, programmable level shifter 300 operates in a manner analogous to that of low-power level shifter 200 of FIG. 2, with PFET P1 of level shifter 300 analogous to PFET LP1 of level shifter 200, PFET P2 of level shifter 300 analogous to PFET LP2 of level shifter 200, the combination of NFETs N1 and N3 of level shifter 300 analogous to NFET LN1 of level shifter 200, and the combination of NFETs N2 and N4 of level shifter 300 analogous to NFET LN2 of level shifter 200. Note that, in combination with NFETs N1 and N2, respectively, selectively enabled NFETs N3 and N4 provide larger effective n-type devices to enable the NFETs to overcome the latch formed by cross-coupled P1 and P2 in the low-power mode. Note that, for applications that do not require such larger effective n-type devices, transistors N3 and N4 and muxes 326 and 328 may be omitted.

In this way, programmable level shifter 300 provides an area-efficient implementation of a level shifter that can be programmed to operate either in high-speed mode to support high-speed applications or in low-power mode to support low-power applications in which high speed is not required. Area efficiency is provided by the fact that transistors P1, P2, N1, and N2 are enabled for both the high-speed mode and the low-power mode and are therefore shared by the two operating modes.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

The present invention may be implemented as (analog, digital, or a hybrid of both analog and digital) circuit-based processes.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Although the present invention has been described in the context of implementations based on FETs, such as metal-oxide semiconductor FETs (also referred to as MOSFET), the present invention can be implemented using other transistor technologies, such as bi-polar transistor technology.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit having a programmable level shifter adapted to selectively operate in either a high-speed mode or a low-power mode to convert an input signal in a first power supply domain into an output signal in a second power supply domain different from the first power supply domain, wherein:

switching speed of the level shifter is higher in the high-speed mode than in the low-power mode;

power consumption of the level shifter is lower in the low-power mode than in the high-speed mode; and the programmable level shifter comprises:

first and second devices that are configured as a current-mirror amplifier in the high-speed mode and as a cross-coupled latch in the low-power mode;

first, second, third, and fourth n-type devices, wherein:

the first and third n-type devices are connected in parallel;

the second and fourth n-type devices are connected in parallel;

in the high-speed mode, the third and fourth n-type devices are disabled; and in the low-power mode, the third and fourth n-type devices are enabled, such that (1) the first and third n-type devices form a first relatively large effective n-type device and (2) the second and fourth n-type devices form a second relatively large effective n-type device.

2. The invention of claim 1, wherein one or more transistors in the programmable level shifter are shared by the high-speed mode and the low-power mode.

3. The invention of claim 1, wherein the first and second devices are p-type devices.

4. The invention of claim 3, wherein the programmable level shifter further comprises third and fourth p-type devices that are controlled by a mode-control signal to configure the first and second p-type devices (1) as the current-mirror amplifier for the high-speed mode and (2) as the cross-coupled latch for the low-power mode.

5. The invention of claim 1, wherein the programmable level shifter further comprises first and second muxes that are controlled by a mode-control signal to (1) disable the third and fourth n-type devices for the high-speed mode and (2) enable the third and fourth n-type devices for the low-power mode.

6. The invention of claim 1, wherein the integrated circuit is an FPGA.

7. An integrated circuit having a programmable level shifter adapted to selectively operate in either a high-speed mode or a low-power mode to convert an input signal in a first power supply domain into an output signal in a second power supply domain different from the first power supply domain, wherein:

switching speed of the level shifter is higher in the high-speed mode than in the low-power mode;

power consumption of the level shifter is lower in the low-power mode than in the high-speed mode; and the programmable level shifter comprises:

first and second p-type devices that are configured as a current-mirror amplifier in the high-speed mode and as a cross-coupled latch in the low-power mode;

third and fourth p-type devices that are controlled by a mode-control signal to configure the first and second p-type devices (1) as the current-mirror amplifier for the high-speed mode and (2) as the cross-coupled latch for the low-power mode;

first, second, third, and fourth n-type devices, wherein the first and third n-type devices are connected in parallel; the second and fourth n-type devices are connected in parallel; in the high-speed mode, the third and fourth n-type devices are disabled; and in the low-power mode, the third and fourth n-type devices are enabled, such that (1) the first and third n-type devices form a first relatively large effective n-type device and (2) the second and fourth n-type devices form a second relatively large effective n-type device; and first and second muxes that are controlled by the mode-control signal to (1) disable the third and fourth n-type devices for the high-speed mode and (2) enable the third and fourth n-type devices for the low-power mode.

8. The invention of claim 7, wherein the first and second p-type devices and the first and second n-type devices are shared by the high-speed mode and the low-power mode.

9. The invention of claim 7, wherein the integrated circuit is an FPGA.

10. An integrated circuit comprising:

first means for converting, in a high-speed mode, an input signal in a first power supply domain into an output signal in a second power supply domain different from the first power supply domain; and second means for converting, in a low-power mode, the input signal in the first power supply domain into the output signal in the second power supply domain, wherein:

switching speed of the first means is higher than switching speed of the second means;

power consumption of the first means is lower than power consumption of the second means;

the first and second means share first and second devices that are configured as a current-mirror amplifier in the first means and as a cross-coupled latch in the second means, wherein:

the second means further comprises first, second, third, and fourth n-type devices;

the first and third n-type devices are connected in parallel in the second means to form a first relatively large effective n-type device;

the second and fourth n-type devices are connected in parallel in the second means to form a second relatively large effective n-type device; and the first and second means share the first and third n-type devices, but not the second and fourth n-type devices.

11. The invention of claim 10, wherein the first and second devices are p-type devices.

12. The invention of claim 11, wherein the integrated circuit further comprises third and fourth p-type devices that are controlled by a mode-control signal to configure the first and second p-type devices (1) as the current-mirror amplifier in the first means and (2) as the cross-coupled latch in the second means.

13. The invention of claim 10, wherein the integrated circuit further comprises first and second muxes that are controlled by a mode-control signal to (1) exclude the third and fourth n-type devices from the first means and (2) include the third and fourth n-type devices in the second means.

14. An integrated circuit having a programmable level shifter adapted to selectively operate in either a high-speed mode or a low-power mode to convert an input signal in a first power supply domain into an output signal in a second power supply domain different from the first power supply domain, wherein:

switching speed of the level shifter is higher in the high-speed mode than in the low-power mode;

power consumption of the level shifter is lower in the low-power mode than in the high-speed mode;

the programmable level shifter comprises first, second, third, and fourth devices, wherein:

the first and third devices are connected in parallel;

the second and fourth devices are connected in parallel;

in the high-speed mode, the third and fourth devices are disabled; and in the low-power mode, the third and fourth devices are enabled, such that (1) the first and third devices form a first relatively large effective device and (2) the second and fourth devices form a second relatively large effective device; and the programmable level shifter further comprises first and second muxes that are controlled by a mode-control signal to (1) disable the third and fourth devices for the high-speed mode and (2) enable the third and fourth devices for the low-power mode.

15. The invention of claim 14, wherein the first, second, third, and fourth devices are n-type devices.

16. The invention of claim 14, wherein the integrated circuit is an FPGA.

* * * * *